United States Patent
Kindt et al.

(10) Patent No.: US 11,828,892 B1
(45) Date of Patent: Nov. 28, 2023

(54) PHOTON COUNTING DETECTOR

(71) Applicant: Teledyne Dalsa B.V., Eindhoven (NL)

(72) Inventors: Willem Johannes Kindt, Eindhoven (NL); Ernest Jannis Phaff, Eindhoven (NL); Daniel Wilhelmus Elisabeth Verbugt, Eindhoven (NL)

(73) Assignee: Teledyne Dalsa B.V., Eindhoven (NL)

( * ) Notice: Subject to any disclaimer, the term of this patent is extended or adjusted under 35 U.S.C. 154(b) by 0 days.

(21) Appl. No.: 18/323,965

(22) Filed: May 25, 2023

(30) Foreign Application Priority Data

Jun. 2, 2022 (EP) .................................. 22177060

(51) Int. Cl.
*G01T 1/24* (2006.01)
*G01T 1/18* (2006.01)

(52) U.S. Cl.
CPC ................ *G01T 1/247* (2013.01); *G01T 1/18* (2013.01); *G01T 1/241* (2013.01)

(58) Field of Classification Search
CPC ............ G01T 1/247; G01T 1/18; G01T 1/241
See application file for complete search history.

(56) References Cited

U.S. PATENT DOCUMENTS

| 2005/0139757 A1* | 6/2005 | Iwanczyk | H01L 27/14618 257/E31.015 |
| 2010/0116999 A1 | 5/2010 | Tuemer | |
| 2021/0022694 A1* | 1/2021 | Spartiotis | H04N 5/32 |

FOREIGN PATENT DOCUMENTS

WO 2021228386 11/2021

* cited by examiner

*Primary Examiner* — Hugh Maupin
(74) *Attorney, Agent, or Firm* — Marcus C. Dawes

(57) ABSTRACT

Aspects of the present disclosure relate to a photon counting detector and to a read-out integrated circuit to be used in such detector. Aspects of the present disclosure particularly relate to X-ray applications.
According to an aspect of the present disclosure, the detector comprises an electrical ground plane arranged at or near an interface between the carrier and at least one ROIC die. Each ROIC die comprises an extension region that laterally extends beyond the photon conversion assembly, wherein peripheral circuitry for a given ROIC die is arranged in the extension region of that ROIC die. The detector comprises at least one electrical connection that connects the power supply line that is arranged on the carrier to the peripheral circuitry of the at least one ROIC die.

19 Claims, 7 Drawing Sheets

PHOTON COUNTING DETECTOR

FIELD

Aspects of the present disclosure relate to a photon counting detector and to a read-out integrated circuit to be used in such detector. Aspects of the present disclosure particularly relate to X-ray applications such as mammography, fluoroscopy, surgery and tomography, extra oral dental, intra oral dental, and non-medical non-destructive testing applications like e.g. pipe-line inspection and security.

BACKGROUND

Photon counting detectors capable of discriminating X-ray photon energies are known in the art. Compared to energy-integrating X-ray detectors working in a continuous mode, energy-resolving photon counting detectors are operated in a pulse mode. These detectors are capable of processing and registering the separate absorption events when an X-ray is absorbed by the detector material. Because photons are counted individually, energy-resolving photon counting detectors have the potential to offer superior noise characteristics when compared to energy-integrating detectors. This makes them attractive candidates to be used in computed tomography, CT, applications. For example, using energy-resolving photon counting detectors, contrast agents can be identified much better during a CT scan.

An energy-resolving photon counting detector comprises a plurality of detector pixels that are arranged in a matrix of rows and columns. A schematic example of a known detector pixel for an energy-resolving photon counting detector is shown in FIG. 1. In this figure, pixel 1 is connected to a photoconductor 2 configured for outputting a first signal as a result of absorbing a photon. Photoconductor 2 can for example be in the form of a photodiode. Alternatively, photoconductor 2 can comprise a piece of photo-absorbing material, such as Cadmium Zinc Telluride, arranged in between electrodes. This latter case is shown in FIG. 1, wherein a first electrode is negatively biased using a voltage source 3 and wherein a second electrode is connected to a detecting unit 4 of pixel 1. Photoconductor 2 outputs a first signal as a result of absorbing a photon. This first signal comprises or is formed by free electrons that are generated by the photon absorption and that are repelled towards the second electrode by the large negative bias being present on the first electrode.

Detecting unit 4 of pixel 1 generates a second signal in dependence of the first signal. This second signal is subsequently provided to a plurality of comparing units 5A, 5B that compare the second signal with respective thresholds. The outputs of comparing units 5A, 5B are connected to respective counters 6A, 6B. After processing many incident photons, the energy spectrum of the incident radiation can be determined by the values stored in counters 6A, 6B.

In the above, detecting unit 4, comparing units 5A, 5B, and counters 6A, 6B are part of processing circuitry that is configured for processing electrical signals from photoconductor 2. Furthermore, photoconductor 2 is an example of a photon conversion assembly that directly converts an incoming X-ray photon into an electrical signal.

FIG. 2 illustrates a known implementation of pixel 1 of FIG. 1. Here, photoconductor 2 is represented by a photodiode 2, and detecting unit 4 comprises a charge sensitive amplifier 4A and a shaper circuit 4B. This latter circuit comprises a combination of a differentiator and an integrator. The various comparing units are combined to form a discriminator bank 5 that includes a plurality of comparators, and the counters are combined into a counter array 6.

As shown by the corresponding signal shapes illustrated below the various components, the first signal outputted by photodiode 2 corresponds to a spike signal representative for the electrons Qin that were generated as a result of the absorption of a photon. This signal is processed by CSA 4A and is converted into a signal Vcsa of which the step height depends on the energy of the absorbed photon. Signal Vcsa is then differentiated by the differentiator of shaper circuit 4B resulting in a signal Vdif. The differentiation will remove any DC components in signal Vcsa. Next, signal Vdif is integrated by the integrator of shaper circuit 4B resulting in a signal Vshaper emerging as the second signal at the output of shaper circuit 4B. The maximum value of second signal Vshaper is indicative for the energy of the absorbed photon.

FIG. 3 illustrates a schematic top view of a known photon counting detector 10. It comprises a plurality of pixels 1 as shown in FIGS. 1 and 2, and peripheral circuitry 20. As shown in FIG. 3, pixels 1 comprise, in addition to the components shown in FIGS. 1 and 2 but which are not all shown in FIG. 3, a shift register 7 that is connected to counter array 6.

FIG. 3 illustrates six pixels 1 being connected to peripheral circuitry 20 for illustrative purposes only. In practice, peripheral circuitry 20 is connected to a large number of pixels 1 that are arranged in a matrix of rows and columns.

Peripheral circuitry 20 comprises a logic unit 21. This unit provides reset signals to pixels 1 through respective reset lines 21A for resetting the counters of the counter arrays 6.

Pixels 1 are configured for processing the electrical signals from photoconductor 2 into digital numbers stored in counter array 6 during an integration period. At the end of the integration period, logic unit 21 generates a transfer signal that is transferred to shift registers 7 of pixels 1 through transfer lines 21B. This allows the data stored in counter arrays 6 of a column of pixels 1 to be clocked into shift registers 7. Hereafter, logic unit 21 will provide a reset signal to the counter arrays 6 of pixels 1 for initiating a next integration period during which the data in shift registers 7 shifts towards logic unit 21. This latter unit will collect the data from pixels 1 of multiple columns and rows. This data is sent to a serializer 22 after which the data is output using a low-voltage differential signaling, LVDS, driver 23 for further processing.

As can be derived from FIG. 3, several lines are connected to pixels 1. For example, supply and ground lines are used for providing supply and ground voltage levels to the processing circuitry of pixels 1. In addition, lines 21A, 21B are used for providing reset and transfer signals, respectively, and data lines are provided for transporting the signals from pixels 1 to logic unit 21.

FIG. 4, bottom figure, illustrates a practical implementation of a known photon counting detector such as the detector shown in FIG. 3. In this detector, photoconductor 2 of FIGS. 1 and 2 is realized using a plurality of butted first dies 31 made of Cadmium Zinc Telluride that are each configured to directly convert an incoming X-ray photon into an electrical signal. As shown in FIG. 4, left, the electrical signals are output via conductive bumps 32 formed on first dies 31 to the processing circuitry of pixels 1 formed in multiple read-out integrated circuit, ROIC, dies 33A-33D.

The cross-section shown in FIG. 4, center bottom, illustrates how first dies 31A-31D are mounted, using bumps 32, on pads 32A of a plurality of ROIC dies 33A-33D. A top view of a ROIC die 33 is shown in the upper right figure. Each ROIC die 33 comprises a conductive substrate and a plurality of pixels 1. In addition, each ROIC die 33 comprises peripheral circuitry 34 for providing various signals and a supply voltage to pixels 1 on ROIC die 33.

As shown in the figure, the presence of peripheral circuitry 34 requires space on ROIC die 33. Consequently, a mismatch exists between the pitch of bumps 32 and the pitch of pixels 1 on ROIC die 33. To address the mismatch, a redistribution layer 35 is used. Redistribution layer 35 comprises a bump part, such as a pad 32A, that is connected to a bump 32, and a track part that extends between the bump part and the actual processing circuitry.

The cross-sectional view in FIG. 4 shows that ROIC dies 33A-33D are mounted on a carrier 36 such as a printed circuit board. Carrier 36 comprises a power supply line that is configured for transferring a supply voltage to peripheral circuitry 34. Carrier 36 also comprises ground lines or planes for guiding a return current.

To allow signal routing to and from peripheral circuitry 34, through silicon vias 34A are used. If the substrate of ROIC dies 33A-33D is conductive, through silicon vias 34A comprise an isolating layer covering an inner wall of vias 34A. This isolating layer is covered by a conductive layer. Vias 34A are used for transferring the supply voltage, ground, data signals and optionally control signals between carrier 36 and ROIC die 33.

Peripheral circuitry 34 is arranged centrally on ROIC die 33, 33A-33D to prevent long supply lines on ROIC die 33 as the ohmic losses associated with such lines would result in heating up of the photon conversion assembly during operation, thereby reducing the efficiency and/or accuracy of the detector. In addition, such losses would worsen noise behavior and would reduce the power efficiency of the detector.

The processing required for making through silicon vias is relatively costly, thereby adding to the overall costs of the detector. A continuing demand exists in the art for cost reduction while keeping substantially the same performance or even providing an improved performance.

According to an aspect of the present disclosure, a photon counting detector is provided in which the use of through hole vias, and the costs associated therewith, can be avoided. This detector comprises an electrical ground plane that is arranged at or near an interface between the carrier and the at least one ROIC die. In addition, each ROIC die comprises an extension region that laterally extends beyond the photon conversion assembly. The peripheral circuitry for a given ROIC die is arranged in the extension region of that ROIC die. Furthermore, the detector comprises at least one electrical connection that connects the power supply line on or in the carrier to the peripheral circuitry of the at least one ROIC die for the purpose of transferring the supply voltage from the power supply line to said peripheral circuitry. The at least one electrical connection preferably extends substantially outside of the at least one ROIC die. For example, the at least one electrical connection may extend through a space between the at least one ROIC die and the carrier.

The combination of these features allows an electrical connection between the power supply line on or in the carrier and the peripheral circuitry of the at least one ROIC die to be made without incurring excessive power consumption associated with the supply of power to the at least one ROIC die. For example, the electrical ground plane may be configured for carrying a return current that is associated with the supply voltage supplied to the peripheral circuitry of the at least one ROIC die through the at least one electrical connection and that flows through the corresponding conductive substrate(s) of the at least one ROIC die. In this case, ground return currents will flow through the conductive substrate and a separate ground line on the at least one ROIC die is not required. Instead, a relatively thick and wide ground plane can be used in which the Ohmic losses are strongly reduced compared to using a dedicated ground line. The space on the at least one ROIC die that would otherwise be used for such dedicated ground line can instead be used for increasing a width of the track or line that transfers the supply voltage to the pixels further reducing the Ohmic losses. Other connections between the carrier and the peripheral circuitry, for example for carrying control signals or data signals, can equally be formed using electrical connections that are similar to the abovementioned electrical connections.

In addition to reduced Ohmic losses, embodiments of the present disclosure allow for the area with circuitry dedicated to one pixel to be larger because the peripheral circuitry is moved to an area outside of the detector pixel area. Furthermore, due to the different arrangement of the peripheral circuitry compared to known ROIC dies, the redistribution layer can be omitted. This reduces the input capacitance seen at the input of the CSAs of the pixels. As noise of the detector decreases with power and increases with input capacitance, it becomes possible to realize the same noise characteristics at a lower power level.

The photon conversion assembly may comprise a plurality of the first dies, preferably arranged in a butted manner. In an embodiment, the number of first dies is larger than the number of ROIC dies. For example, multiple first dies among the at least one first die are mounted to a single ROIC die among the at least one ROIC die.

The ROIC die may have an elongated form. As an example, a length of the ROIC die may be at least 4 times larger than the width of the ROIC die. Typically, the length of a ROIC die lies in a range between 40 and 100 mm, and the width of the ROIC die between 10 and 20 mm. The pixels of each ROIC die can be uniformly arranged in a matrix of rows and columns, wherein a pixel pitch in a column direction corresponds to 1/m times a pitch of the first dies in that same direction or wherein a pixel pitch in a row direction corresponds to 1/n times a pitch of the first dies in that same direction, wherein m and n are integer numbers.

The at least one ROIC die may comprise a plurality of ROIC dies, preferably arranged in a butted manner, wherein each ROIC die is preferably one-side, two-side, or three-side buttable. Arranging the buttable dies next to each other results in an overall pixel matrix that comprises the individual pixel matrices of the ROIC dies and for which the pixel pitches in row and column directions are identical to those of the individual pixel matrices.

The at least one electrical connection may comprise one or more bondwires. Other connection types of the electrical connection between the power supply line on or in the carrier and the peripheral circuitry are not excluded. Other connections for carrying control lines, data lines and the like can also be realized using bondwires.

Each ROIC die may comprise a first surface at or near which the plurality of pixels is formed in or on the conductive substrate of that ROIC die, and an opposing second surface that faces the carrier, wherein the electrical ground plane is arranged at or near the second surface(s) of the at least one ROIC die. It is noted that the ROIC die typically comprises a semiconductor die having a conductive substrate and one or more epitaxial layers formed on the conductive substrate. Typically, the pixels are formed in the one or more epitaxial layers.

The at least one ROIC die can be provided with a first metal assembly comprising one or more metals, and the carrier can be provided with a second metal assembly comprising one or more metals, wherein the first metal assembly of the at least one ROIC die and the second metal assembly are fixedly connected to each other, and wherein the first metal assembly and the second metal assembly at least partially jointly form the electrical ground plane.

Each ROIC die can be mounted to the carrier using a conductor arranged in between the carrier and that ROIC die, wherein the conductor at least partially forms the electrical ground plane. The conductor may comprise a conductive glue, a conductive epoxy such as silver epoxy, solder, a conductive tape, and/or an anisotropically conductive film. In so far multiple ROIC dies are used, the conductors arranged in between the plurality of ROIC dies and the carrier may form a contiguous conductor.

The conductor can be used in combination with the first and second metal assembly described above. In other embodiments, the first metal assembly is used in conjunction with the conductor without the second metal assembly or the second metal assembly is used in conjunction with the conductor without the first metal assembly.

The processing circuitry of each ROIC die may comprise a lithographically stitched repetition of a processing circuitry unit. The processing circuitry unit comprises a uniform matrix of said pixels, and power lines for carrying the supply voltage to each pixel in the matrix of said pixels. The processing circuitry may also comprise other lines for carrying data and control signals. The power lines of processing circuitry units that are adjacently arranged in a first direction can be connected for forming a combined power line, wherein the power line of an outer processing circuitry unit in the first direction is connected to the peripheral circuitry of that ROIC die. Similar considerations hold for the above-mentioned other lines.

Each first die may comprise a plurality of first electrical contacts, and each pixel of the at least one ROIC die may comprise a second electrical contact by which that pixel is electrically connected to a respective first electrical contact of a first die among the at least one first dies. Furthermore, the first contacts on each first die can be arranged in matrix of rows and columns such that a pitch of the first electrical contacts in a column direction is equal to a pitch of the pixels of the at least one ROIC die in that same direction, and wherein a pitch of the first electrical contacts in a row direction is equal to a pitch of the pixels of the at least one ROIC die in that same direction.

The carrier can be a printed circuit board. Typically, the carrier is a multi-layer structure comprising metal tracks on several layers. The at least one first die may comprise a die made of material out of the group consisting of Cadmium Zinc Telluride, Cadmium Telluride, amorphous Selenium, Silicon, Gallium Arsenide, Germanium, or any other material that allows direct convention of photons. Additionally or alternatively, the at least one ROIC die may comprise Silicon-based complementary metal-oxide-semiconductor transistors.

According to a further aspect of the present disclosure, a read-out integrated circuit, ROIC, die is provided that is configured to be used in a photon counting detector as described above. This ROIC die comprises a conductive substrate, a plurality of pixels formed on a frontside of the ROIC die and each comprising processing circuitry for processing an electrical signal received from a photon conversion assembly, and peripheral circuitry from which a supply voltage is provided to the processing circuitry of the pixels of that ROIC die.

Each ROIC die comprises an extension region arranged near an edge of the ROIC die, wherein the peripheral circuitry for a given ROIC die is arranged in the extension region of that ROIC die, and wherein the ROIC die comprises a first metal assembly comprising one or more metals arranged on a backside of the ROIC die.

The processing circuitry of the ROIC die comprises a lithographically stitched repetition of a processing circuitry unit, the processing circuitry unit comprising a uniform matrix of said pixels, and power lines for carrying power to each pixel in the matrix of said pixels. Furthermore, the power lines of processing circuitry units that are adjacently arranged in a first direction are connected for forming a combined power line, and wherein the power line of an outer processing circuitry unit in the first direction is connected to the peripheral circuitry of the ROIC die.

The ROIC die is preferably configured such that during operation, a return current associated a current flowing through the combined power line flows through the first metal assembly.

In the detector, and more in particular in the ROIC die(s), the peripheral circuitry may comprise metal tracks, lines or other structures, for distributing the supply voltage to the pixels on the ROIC die(s). These tracks, lines or other structures may be electrically connected to a bondpad, which in turn is connected to a bondwire through which the supply voltage is received from the power supply line on the carrier.

The peripheral circuitry may have additional functions such as controlling the pixels, providing reference signals to the pixels, performing data serialization and low-voltage differential signaling.

Although particularly useful for conversion of X-ray photons, the present disclosure is not limited thereto and could equally be used for visible or infrared light applications.

DESCRIPTION OF THE DRAWINGS

Next, the present disclosure will be described in more detail with reference to the appended drawings, wherein.

Figure 1:
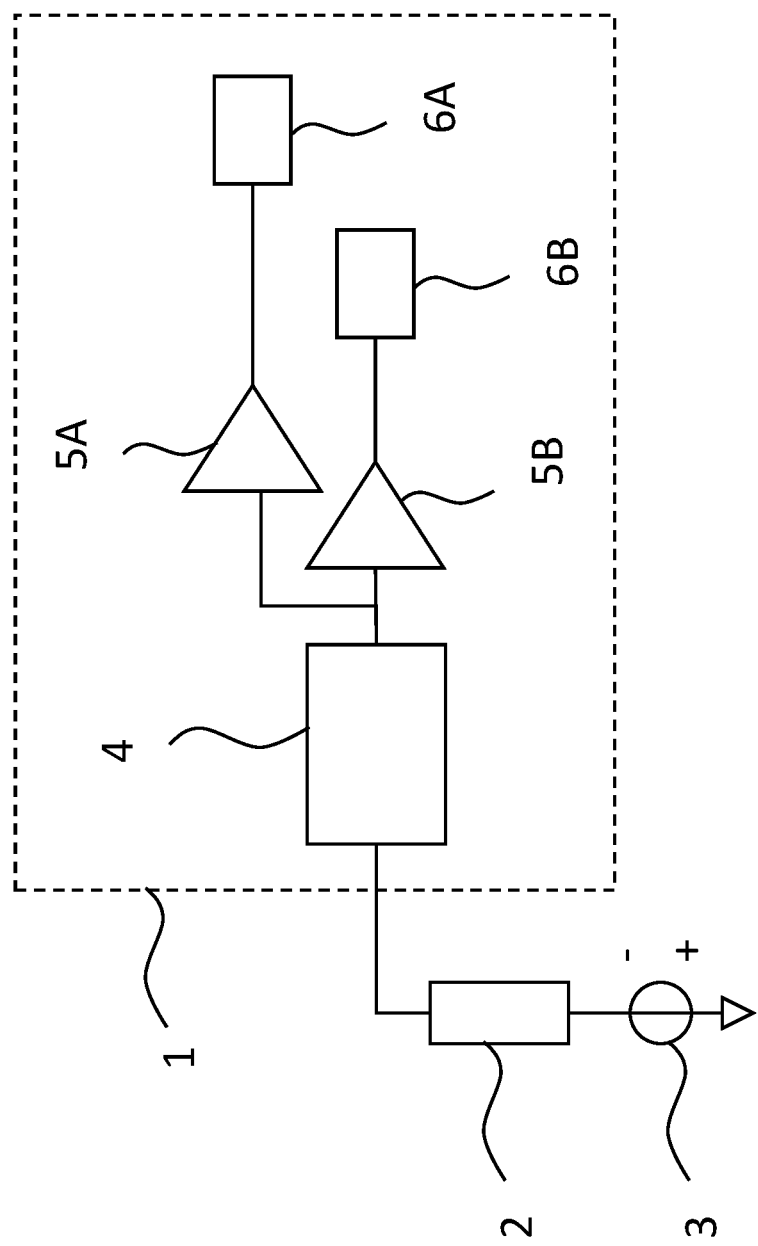
FIG. 1 illustrates a schematic example of a known detector pixel for an energy-resolving photon counting detector.
Figure 2:
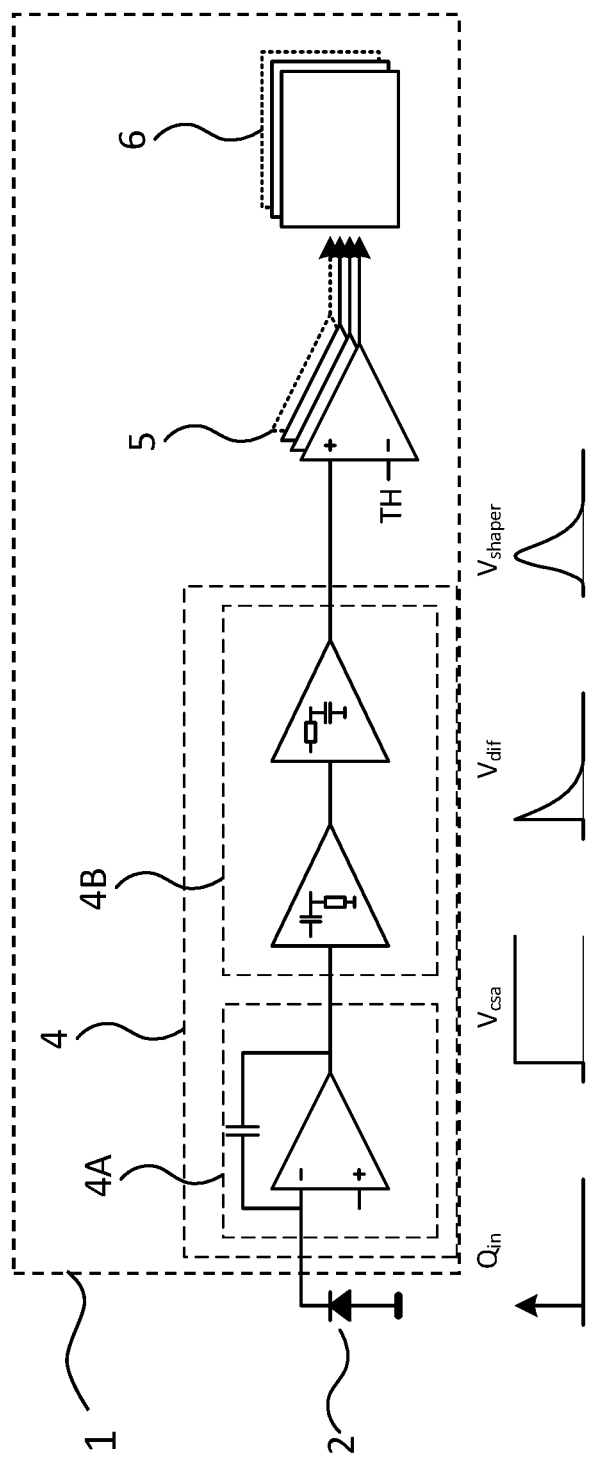
FIG. 2 illustrates a known implementation of the detector pixel of FIG. 1.
Figure 3:
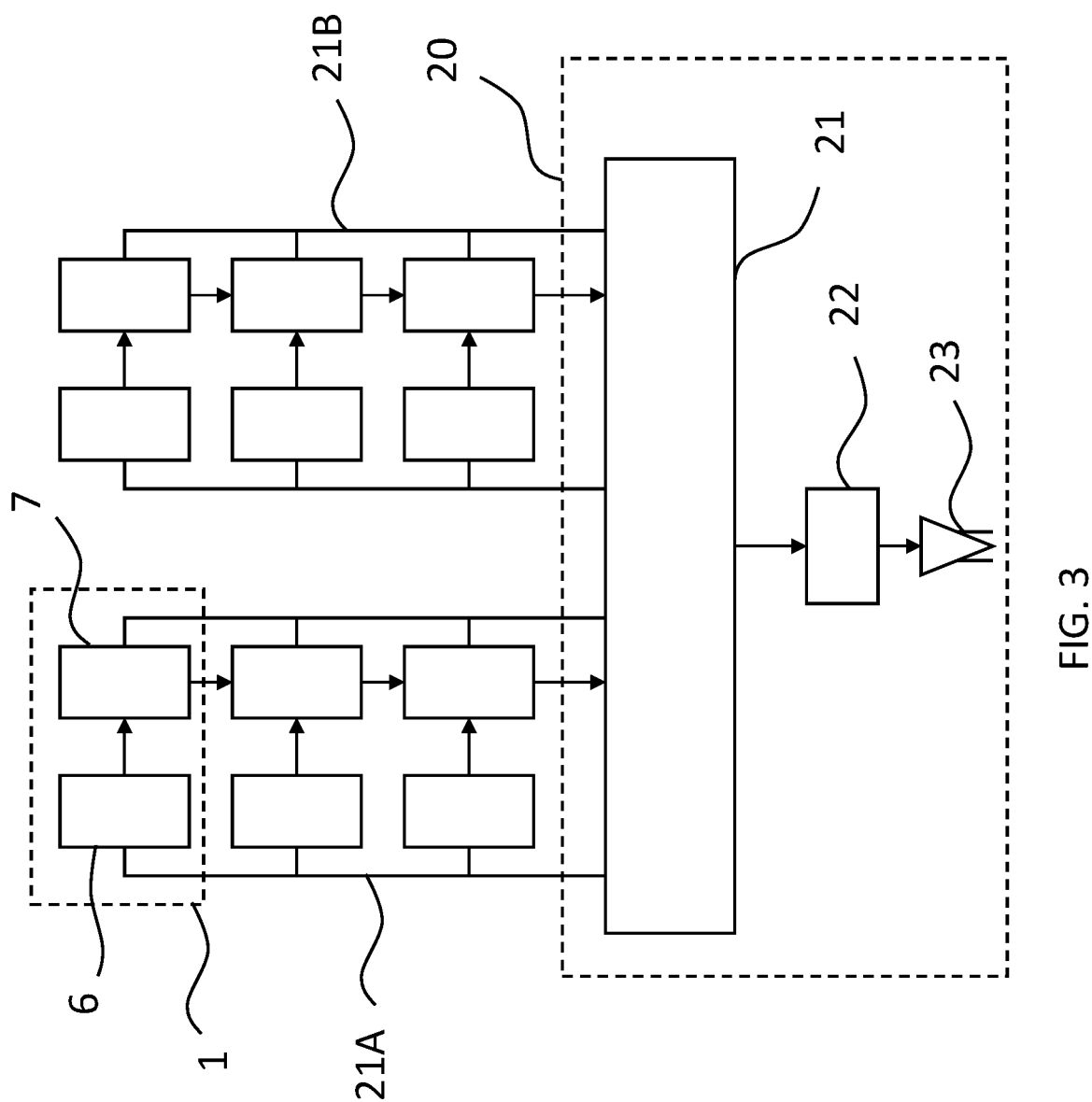
FIG. 3 illustrates a schematic view of a known photon counting detector.
Figure 4:
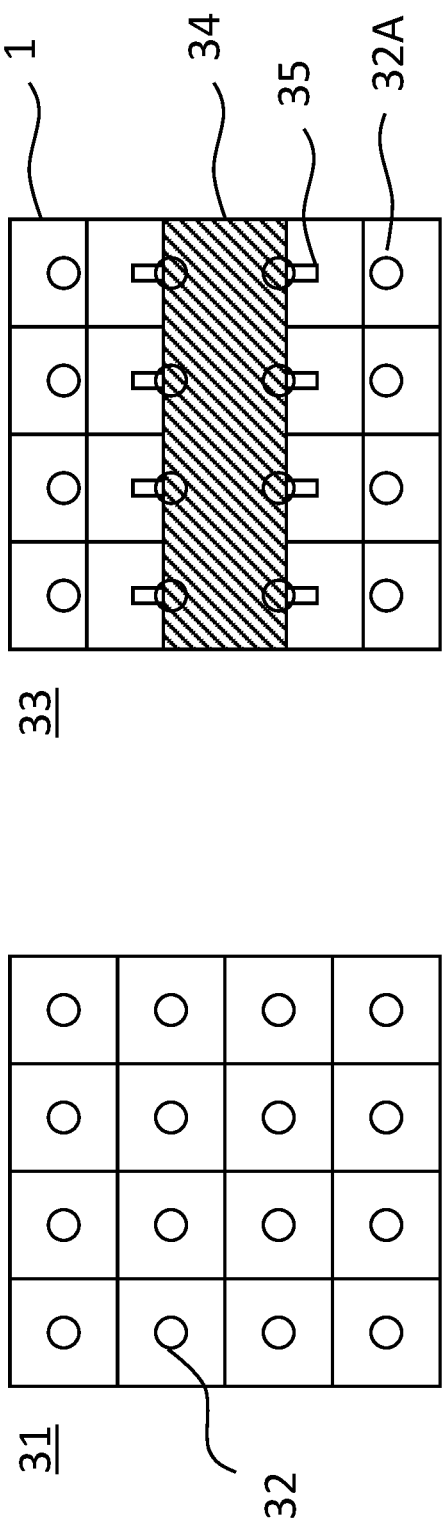
FIG. 4 illustrates a bottom view of a known first die of a photon conversion assembly (left), a bottom view of a known ROIC die (right), and a schematic cross-section of a known energy-resolving photon counting detector (bottom)
Figure 4:
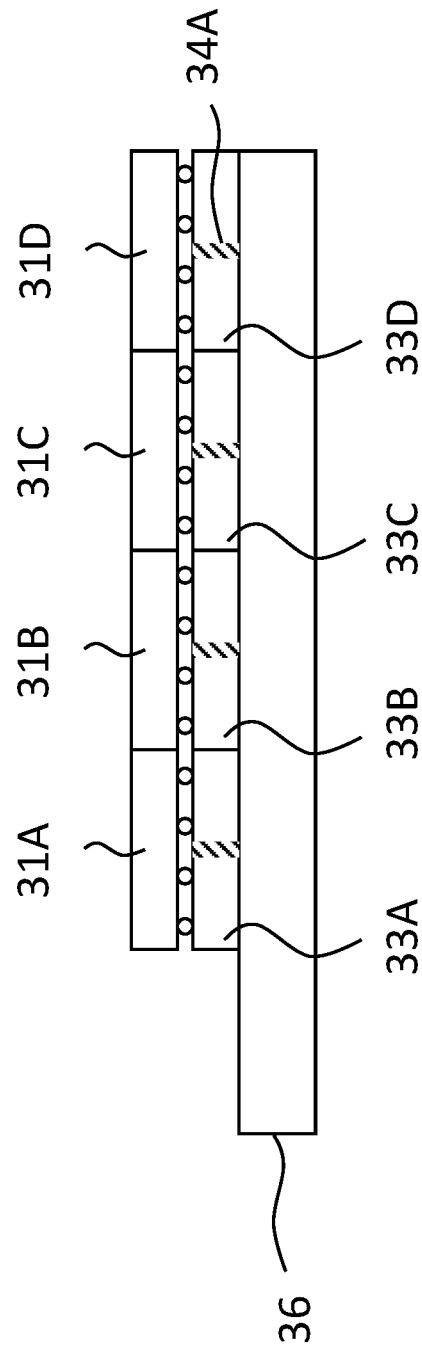

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

Unless the context clearly requires otherwise, throughout the description and the claims, the words "comprise", "comprising" and the like are to be construed in an inclusive sense, as opposed to an exclusive or exhaustive sense; that is to say, in the sense of "including, but not limited to". As used herein, the terms "connected", "coupled" or any variant thereof means any connection or coupling, either direct or indirect, between two or more elements; the coupling or connection between the elements can be physical, logical, electromagnetic, or a combination thereof. Additionally, the words "herein", "above", "below" and words of similar import, when used in this application, refer to this application as a whole and not to any particular portions of this application. Where the context permits, words in the detailed description using the singular or plural number may also include the plural or singular number respectively. The word "or" in reference to a list of two or more items, covers all of the following interpretations of the word: any of the items in the list, all of the items in the list, and any combination of the items in the list.

The teachings of the technology provided herein can be applied to other systems, not necessarily the system described below. The elements and acts of the various examples described below can be combined to provide further implementations of the technology. Some alternative implementations of the technology may include not only additional elements to those implementations noted below, but also may include fewer elements.

These and other changes can be made to the technology in light of the following detailed description. While the description describes certain examples of the technology, and describes the best mode contemplated, no matter how detailed the description appears, the technology can be practiced in many ways. Details of the system may vary considerably in its specific implementation, while still being encompassed by the technology disclosed herein. As noted above, particular terminology used when describing certain features or aspects of the technology should not be taken to imply that the terminology is being redefined herein to be restricted to any specific characteristics, features, or aspects of the technology with which that terminology is associated. In general, the terms used in the following claims should not be construed to limit the technology to the specific examples disclosed in the specification, unless the detailed description section explicitly defines such terms. Accordingly, the actual scope of the technology encompasses not only the disclosed examples, but also all equivalent ways of practicing or implementing the technology under the claims.

To reduce the number of claims, certain aspects of the technology are presented below in certain claim forms, but the applicant contemplates the various aspects of the technology in any number of claim forms.

Figure 5:
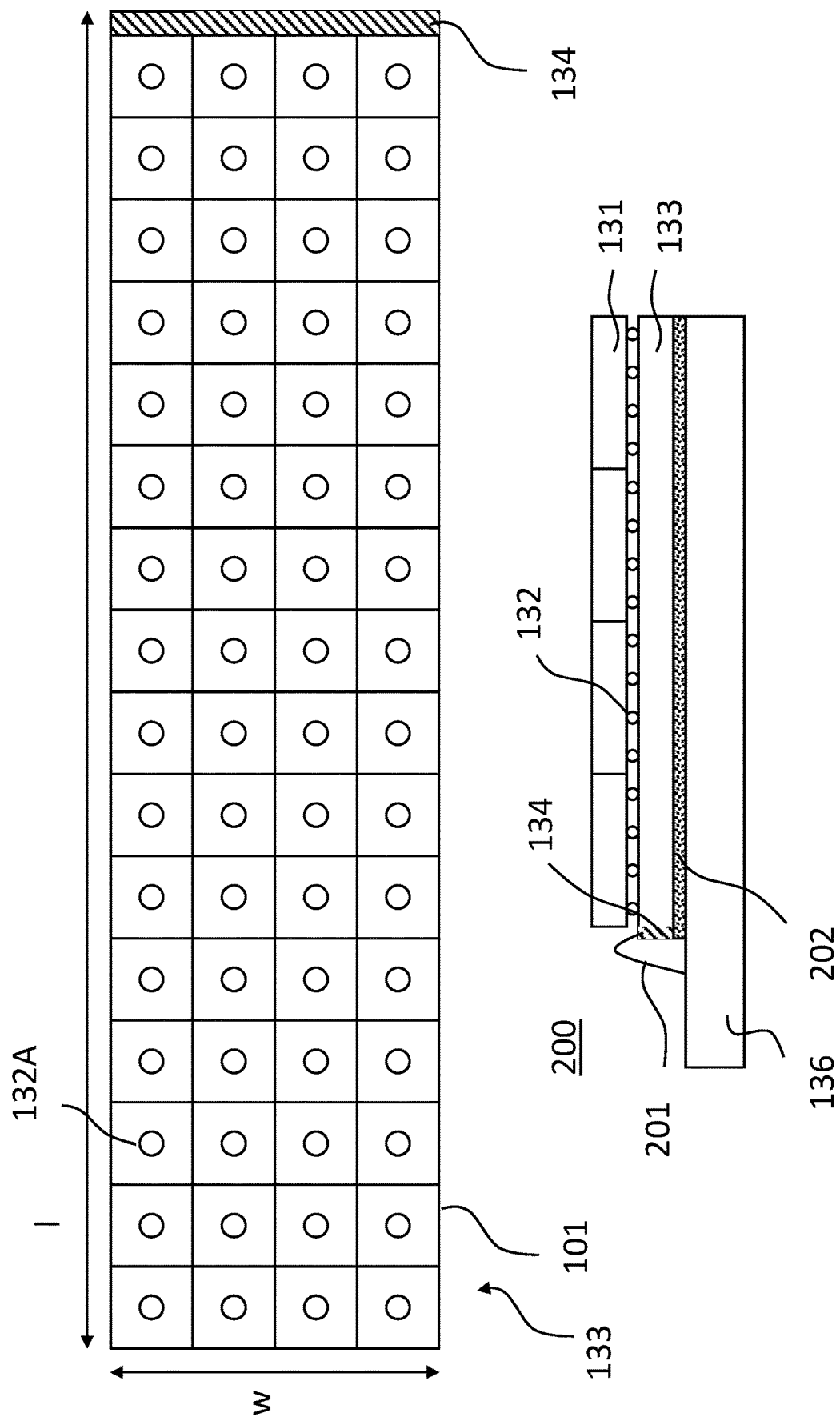
FIG. 5 illustrates a top view of a ROIC die according to an aspect of the present disclosure (top), and a schematic cross-section of an energy-resolving photon counting detector according to an aspect of the present disclosure (bottom)

FIG. 5, top, illustrates a schematic top view of a ROIC die 133 according to an aspect of the present disclosure. FIG. 5, bottom, illustrates a schematic cross-section of a detector 200 comprising such a ROIC die. ROIC die 133 has an elongated form with a width w and a length l and comprises a plurality of pixels 101 arranged in a matrix of rows and columns. Preferably, the ratio l>w is greater than 2, more preferably greater than 4. Furthermore, ROIC die 133 comprises peripheral circuitry 134 that provides control signals to pixels 101, receives electrical signals from pixels 101, and provides a supply voltage to pixels 101, using a plurality of conductive tracks (not shown) that extend across ROIC die 133. As shown, peripheral circuitry 134 is arranged near an edge of ROIC die 133. Furthermore, each pixel 101 comprises an electrical contact in the form of a circular pad 132A.

Detector 200 shown in FIG. 5, bottom, comprises four first dies 131 that are mounted to a single ROIC die 133. Each first die 131 comprises at least one bump 132 by which contact is made with a respective ROIC die 133 via a pad 132A. Peripheral circuitry 134 is connected to a power supply line (not shown) on carrier 136 using one or more bondwires 201. A conductive ground plane 202 is arranged in between ROIC die 133 and carrier 136. Similar connections could be made between other lines, such as control lines and data lines on ROIC die 133, and corresponding lines on carrier 136.

Figure 6:
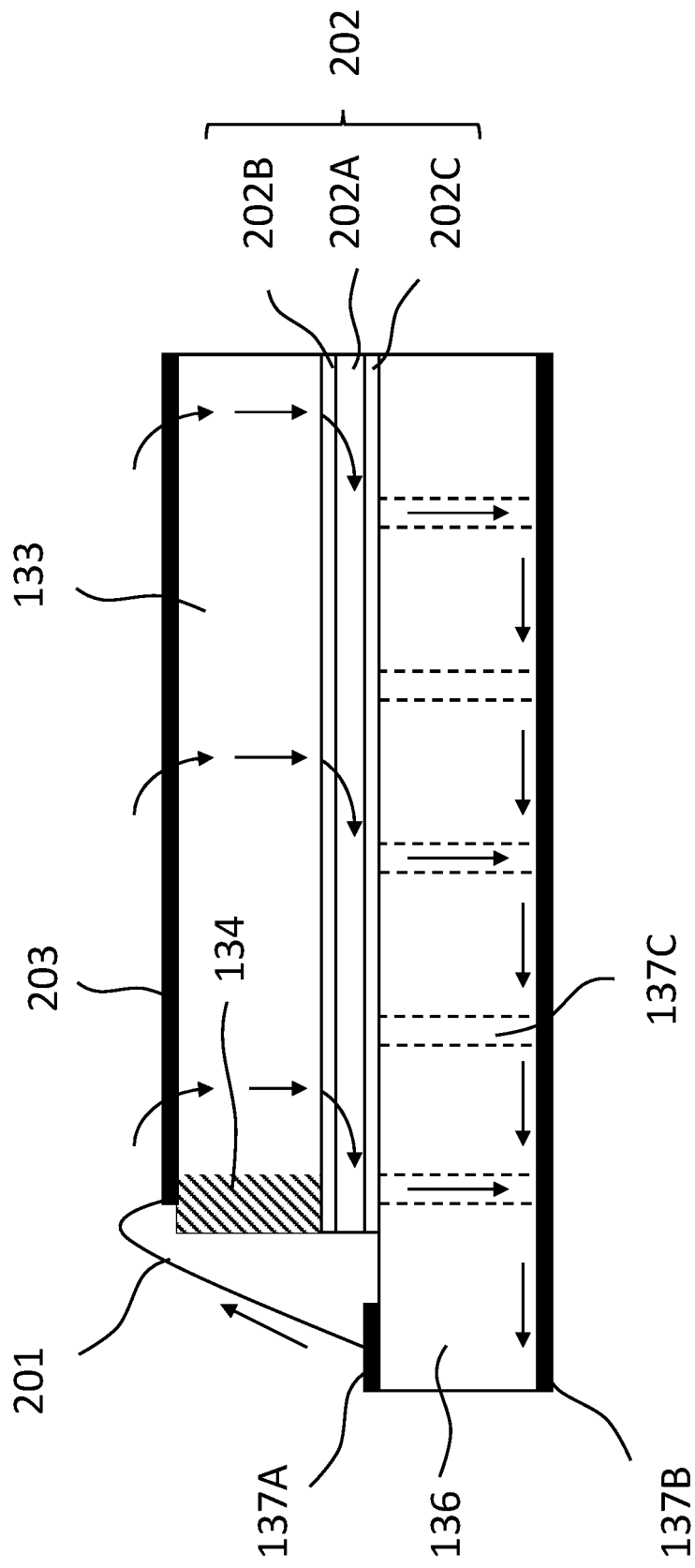
FIG. 6 illustrates a supply current path in a schematic cross-section of an energy-resolving photon counting detector according to an aspect of the present disclosure.

A partial detailed view of a cross-section of detector 200 is shown in FIG. 6. In this view, first dies 131 are omitted and power supply line 137A on carrier 136 is connected to peripheral circuitry 134 using a bondwire 201. Also shown is a ground plane 137B arranged on a backside of carrier 136, which is embodied as a printed circuit board. From peripheral circuitry 134, a supply line 203 extends to the various pixels on ROIC die 133.

The carrier can also just be a piece of metal, or a ceramic printed circuit board. If the carrier is metal, then the entire carrier becomes the conductive ground plane. In that case, power supply line 137A can be arranged on a small printed circuit board that is glued or otherwise fixated on the metal carrier next to the ROIC die.

In FIG. 6, electrical ground plane 202 comprises a first metal assembly 202B arranged on a backside of ROIC die 133, and a second metal assembly 202C arranged on carrier 136. In between assemblies 202B, 202C, a conductive layer is arranged by which assemblies 202B, 202C are fixedly connected. Conductive layer comprises a layer of conductive epoxy. In addition, vias 137C are provided that electrically connect second metal assembly 202 to ground 137B of carrier 136. In other embodiments, a single layer is used for forming electrical ground plane 202.

The arrows in FIG. 6 illustrate the current flow through ROIC die 133, which starts at bondwires 137A, then flows through metal layers on the front-surface of ROIC die 133 including supply line 203, then flows through the substrate of ROIC die 133 towards electrical ground plane 202, and then returns to the left through vias 137C and ground plane 137B.

Figure 7:
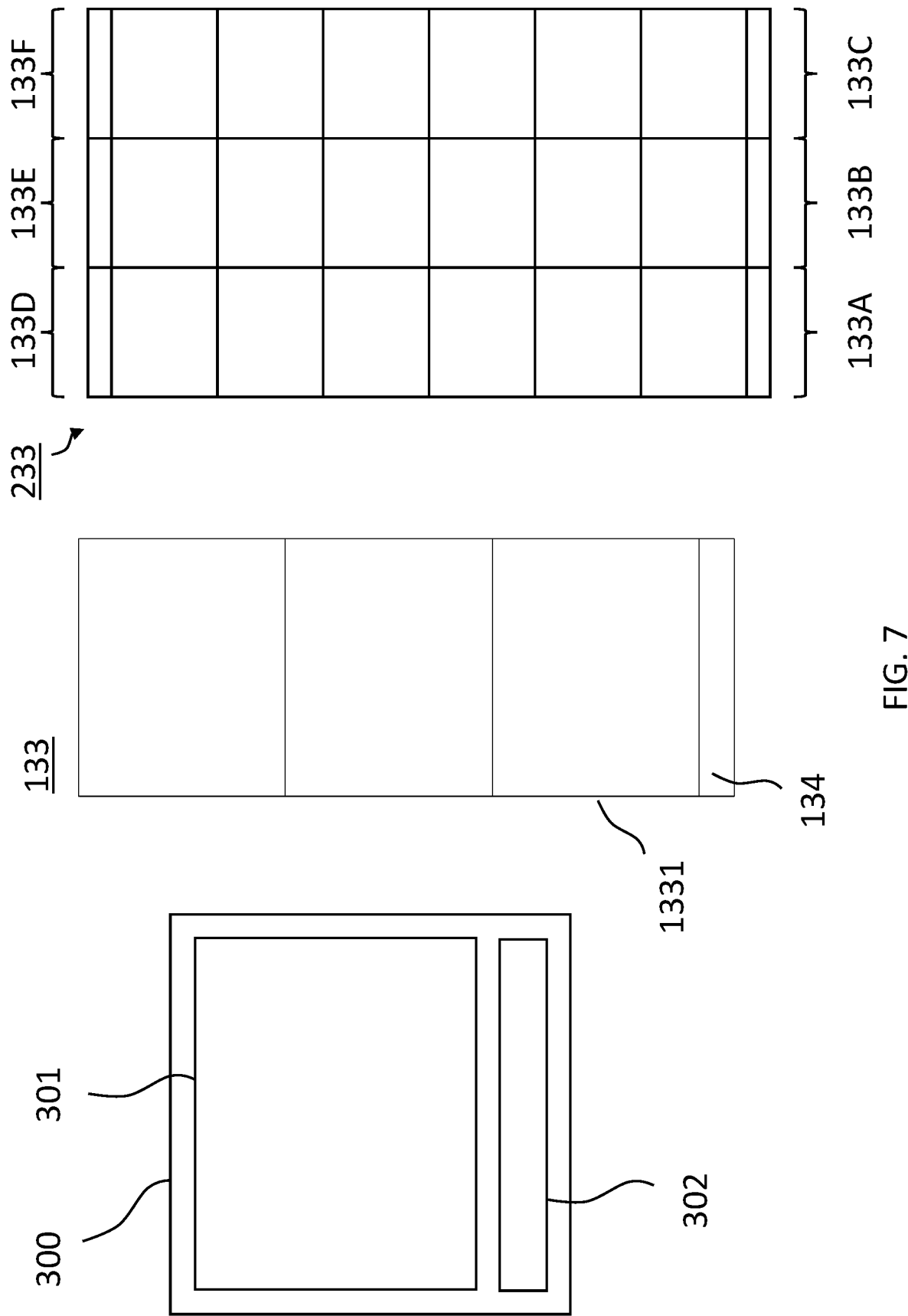
FIG. 7 illustrates an example of a reticle for manufacturing a ROIC die according to an aspect of the present disclosure, (left), a top view of ROIC die made using such reticle (center), and a combination of multiple ROIC dies (right).

FIG. 7, left, illustrates a reticle 300 to be used for the manufacturing of a ROIC die 133 in accordance with the present invention, Reticle 300 is part of a set of reticles that may be used during the photolithographic manufacturing of ROIC die 133. Reticle 300 comprises a pixel region 301 that comprises structures for realizing a processing circuitry unit. On the final ROIC die 133, this unit is repeatedly and adjacently formed in a process known as stitching. Photolithographic stitching is a known technique for imaging identical units on a semiconductor wafer next to each other.

The processing circuitry unit comprises a uniform matrix of pixels, and power lines for carrying the supply voltage to each pixel in the matrix of said pixels. In addition, the processing circuitry unit has other lines as well, such as control lines and data lines. Reticle 300 further comprises a region 302 that comprises structures for forming peripheral circuitry 134.

Due to their adjacent and/or slightly overlapping arrangement, the processing circuitry units together form a larger matrix of pixels. Moreover, the various lines, such as power lines, control lines, and data lines, jointly form larger lines that extend across ROIC die 133.

The center figure in FIG. 7 illustrates a schematic top view of a ROIC die 133 obtained using reticle 300. As shown, ROIC die 133 comprises thee processing circuitry units 1331 and a single block comprising peripheral circuitry 134.

ROIC die 133 can be buttable. In the figure on the right in FIG. 7 an example of a ROIC die assembly 233 is shown that comprises six identical ROIC dies 133A-133F that are buttable at three sides. In this manner, eighteen processing circuitry units 1331 are formed that jointly form one uniform matrix of pixels. Using buttable ROIC dies 133 allow detectors to be build that are larger than the size of a single ROIC die 133, optionally even larger than the semiconductor wafer that was used for manufacturing the individual ROIC dies 133. Using stitching allows the circuitry on the ROIC die to be larger than what could be obtained with a given size of the reticles(s) without stitching.

The ensuing description above provides preferred exemplary embodiment(s) only, and is not intended to limit the scope, applicability, or configuration of the disclosure. Rather, the ensuing description of the preferred exemplary embodiment(s) will provide those skilled in the art with an enabling description for implementing a preferred exemplary embodiment of the disclosure, it being understood that various changes may be made in the function and arrangement of elements, including various modifications and/or combinations of features from different embodiments, without departing from the scope of the present disclosure as defined by the appended claims

The invention claimed is:

1. A photon counting detector, comprising:
a photon conversion assembly comprising at least one first die that is configured to directly convert incoming X-ray photons into electrical signals;
a carrier on or in which a power supply line is arranged that is configured for transferring a supply voltage;
at least one read-out integrated circuit, ROIC, die, each ROIC die comprising:
a conductive substrate;
a plurality of pixels each comprising processing circuitry for processing an electrical signal received from the photon conversion assembly; and
peripheral circuitry from which the supply voltage is provided to the processing circuitry of the pixels of that ROIC die; and
wherein the photon conversion assembly is mounted on the at least one ROIC die, and wherein the at least one ROIC die is mounted on the carrier;
wherein the photon counting detector comprises an electrical ground plane arranged at or near an interface between the carrier and the at least one ROIC die, and in that each ROIC die comprises an extension region that laterally extends beyond the photon conversion assembly, wherein the peripheral circuitry for a given ROIC die is arranged in the extension region of that ROIC die;
wherein the photon counting detector comprises at least one electrical connection that connects the power supply line to the peripheral circuitry of the at least one ROIC die for the purpose of transferring the supply voltage from the power supply line to said peripheral circuitry; and
wherein the electrical ground plane is configured for carrying a return current that is associated with the supply voltage supplied to the peripheral circuitry of the at least one ROIC die through the at least one electrical connection and that flows through the corresponding conductive substrate(s).

2. The photon counting detector according to claim 1, wherein the photon conversion assembly comprises a plurality of said first dies.

3. The photon counting detector according to claim 2, wherein the first dies are arranged in a butted manner.

4. The photon counting detector according to claim 2, wherein multiple first dies among the at least one first die are mounted to a single ROIC die among the at least one ROIC die.

5. The photon counting detector according to claim 2, wherein the pixels of each ROIC die are uniformly arranged in a matrix of rows and columns, wherein a pixel pitch in a column direction corresponds to $1/m$ times a pitch of the first dies in that same direction or wherein a pixel pitch in a row direction corresponds to $1/n$ times a pitch of the first dies in that same direction, wherein m and n are integer numbers.

6. The photon counting detector according to claim 1, wherein the at least one ROIC die comprises a plurality of ROIC dies.

7. The photon counting detector according to claim 6, wherein each ROIC die is one-side, two-side, or three-side buttable, and wherein the ROIC dies are arranged in a butted manner.

8. The photon counting detector according to claim 1, wherein the at least one electrical connection comprises one or more bondwires.

9. The photon counting detector according to claim 1, wherein each ROIC die comprises a first surface at or near which the plurality of pixels is formed in or on the conductive substrate of that ROIC die, and an opposing second surface that faces the carrier, wherein the electrical ground plane is arranged at or near the second surface(s) of the at least one ROIC die.

10. The photon counting detector according to claim 1, wherein the at least one ROIC die is provided with a first metal assembly comprising one or more metals, and wherein the carrier is provided with a second metal assembly comprising one or more metals, wherein the first metal assembly of the at least one ROIC die and the second metal assembly are fixedly connected to each other, wherein the first metal assembly and the second metal assembly at least partially jointly form the electrical ground plane.

11. The photon counting detector according to claim 1, wherein each ROIC die is mounted to the carrier using a conductor arranged in between the carrier and that ROIC die, wherein the conductor at least partially forms the electrical ground plane.

12. The photon counting detector according to claim 11, wherein the conductor comprises a conductive glue, a conductive epoxy such as silver epoxy, solder, a conductive tape, and/or an anisotropically conductive film.

13. The photon counting detector according to claim 12, wherein the at least one ROIC die comprises a plurality of ROIC dies, wherein the conductors arranged in between the plurality of ROIC dies and the carrier form a contiguous conductor.

14. The photon counting detector according to claim 1, wherein the processing circuitry of each ROIC die comprises a lithographically stitched repetition of a processing circuitry unit, the processing circuitry unit comprising a uniform matrix of said pixels, and power lines for carrying power to each pixel in the matrix of said pixels;

wherein the power lines of processing circuitry units that are adjacently arranged in a first direction are connected for forming a combined power line, and wherein the power line of an outer processing circuitry unit in the first direction is connected to the peripheral circuitry of that ROIC die.

15. The photon counting detector according to claim 1, wherein each first die comprises a plurality of first electrical contacts, wherein each pixel of the at least one ROIC die comprises a second electrical contact by which that pixel is electrically connected to a respective first electrical contact of a first die among the at least one first dies.

16. The photon counting detector according to claim 15, wherein the first contacts on each first die are arranged in matrix of rows and columns such that a pitch of the first electrical contacts in a column direction is equal to a pitch of the pixels of the at least one ROIC die in that same direction, or wherein a pitch of the first electrical contacts in a row direction is equal to a pitch of the pixels of the at least one ROIC die in that same direction.

17. The photon counting detector according to claim 1, wherein the carrier is a printed circuit board; and/or wherein the plurality of butted first dies each comprise a die made of material out of the group consisting of Cadmium Zinc Telluride, Cadmium Telluride, amorphous Selenium, Silicon, Gallium Arsenide and Germanium; and/or wherein each ROIC die comprises Silicon-based complementary metal-oxide-semiconductor transistors.

18. A read-out integrated circuit, ROIC, die configured to be used in a photon counting detector as defined in claim 1, comprising:

a conductive substrate;

a plurality of pixels formed on a frontside of the ROIC die and each comprising processing circuitry for processing an electrical signal received from a photon conversion assembly; and peripheral circuitry from which a supply voltage is provided to the processing circuitry of the pixels of that ROIC die;

wherein each ROIC die comprises an extension region arranged near an edge of the ROIC die, wherein the peripheral circuitry for a given ROIC die is arranged in the extension region of that ROIC die, and wherein the ROIC die comprises a first metal assembly comprising one or more metals arranged on a backside of the ROIC die;

wherein the processing circuitry of the ROIC die comprises a lithographically stitched repetition of a processing circuitry unit, the processing circuitry unit comprising a uniform matrix of said pixels, and power lines for carrying power to each pixel in the matrix of said pixels;

wherein the power lines of processing circuitry units that are adjacently arranged in a first direction are connected for forming a combined power line, and wherein the power line of an outer processing circuitry unit in the first direction is connected to the peripheral circuitry of the ROIC die.

19. The ROIC according to claim 18, wherein the ROIC die is configured such that during operation, a return current associated a current flowing through the combined power line flows through the first metal assembly.

* * * * *